PHASE STABILIZATION OF SWEPT FREQUENCY OSCILLATORS

Filed May 18, 1967

Inventors:
Wilfred Sinden Mortley
Stuart Norman Radcliffe
and
Stanley Frederick Clarke
BY
Baldwin Wight Diller & Brown
ATTORNEYS

PHASE STABILIZATION OF SWEPT FREQUENCY OSCILLATORS

Inventors:
Wilfred Sinden Mortley
Stuart Norman Radcliffe
and
Stanley Frederick Clarke
BY
Baldwin Wight Diller & Brown
ATTORNEYS United States Patent Office 3,421,112

Patented Jan. 7, 1969

3,421,112
PHASE STABILIZATION OF SWEPT FREQUENCY OSCILLATORS

Wilfred Sinden Mortley, Great Baddow, Stuart Norman Radcliffe, Shenfield, and Stanley Frederick Clarke, Chelmsford, England, assignors to The Marconi Company Limited, London, England, a British company Filed May 18, 1967, Ser. No. 639,400
Claims priority, application Great Britain, June 23, 1966, 28,087/66

U.S. Cl. 331—178 9 Claims
Int. Cl. H03b *3/06*

ABSTRACT OF THE DISCLOSURE

An arrangement for making a frequency swept oscillator coherent with a reference oscillation at any chosen frequency in the swept band includes a phase detector connected to compare oscillations from a reference source and a swept frequency oscillator. The detected output is applied via a gate to a filter whose output is used to control the frequency of the swept frequency oscillator outside a required sweep region to lock its phase to that of the reference frequency source.

Figure 1:
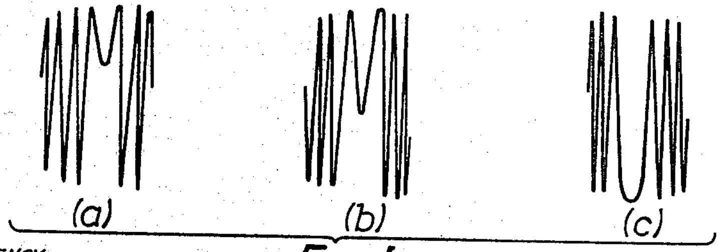

This invention relates to oscillators and more specifically to frequency-swept oscillators, that is to say to oscillators the frequency of which is varied or "swept" over a band of frequencies in pre-determined manner. The principal object of the invention is to enable the oscillations from a frequency swept oscillator to be made coherent with oscillations from another source at any chosen frequency within the swept band.

In radar systems of the so-called pulse compression type wherein a linear, or nearly linear frequency sweep is employed at the transmitter, it is common to produce the sweep by means of a dispersive network or device to which a short pulse of carrier energy is fed and which produces therefrom a longer pulse of swept frequency. It is, however, sometimes difficult to feed into the dispersive network or device a short pulse of sufficient energy to produce a frequency swept output pulse of sufficiently high signal/noise ratio. Moreover there are practical difficulties in the design and manufacture of such arrangements using dispersive networks or devices for the purpose in question and they tend to be expensive. In many cases the use of a frequency swept oscillator to produce the required sweep would offer substantial practical advantages but in some radar systems (for example in Moving Target Indicator radar systems and in pulse-Doppler radar systems) it is necessary to provide pulse-to-pulse coherence with a continuous wave (CW) reference oscillation. This presents no great difficulties if the sweep is produced by a dispersive network or device because the required coherence can be obtained merely by using the reference oscillation source as the carrier in the short pulse fed in to said dispersive network or device. Frequency swept oscillators as at present known are very difficult to make coherent in the foregoing sense and it is difficult to extract from them a continuous wave oscillation which could be used as a reference. The present invention seeks to provide means for making a frequency swept oscillator coherent with a reference oscillation at any chosen frequency in the swept band.

According to this invention in its broadest aspect a swept frequency oscillator arrangement comprises a swept frequency oscillator and means including a phase detector connected to compare oscillations from said oscillator with continuous wave reference frequency oscillations for modulating the oscillator frequency outside a required sweep region so as to establish a phase lock loop between the source of reference frequency oscillations and the oscillator.

According to a feature of this invention a swept frequency oscillator arrangement comprises a swept frequency oscillator, a source of reference frequency, a phase detector fed with oscillations from said oscillator and with reference frequency oscillations, and means for utilising the phase reversal occurring in the output from said detector when the swept oscillator frequency passes through the reference frequency for varying the frequency of the oscillator outside a required sweep region so as to lock its phase with that of the reference frequency source. In order to control the oscillator frequency during periods between sweeps it is convenient to use a diode to which is applied a reference voltage which is varied by the output of the detector and is employed to "catch" the end of the sweep.

Preferably the output of the phase detector is gated, once per sweep of the oscillator to separate that portion of said output during which the frequency of the oscillator approximates to the reference frequency and the separated portion is employed to control the oscillator frequency. Unless the sweep recurrence frequency of the oscillator is quite high it will not in practice be satisfactory to use the phase detector output directly for frequency control of the oscillator. However, separation of said portion may conveniently be effected by a gate controlled by pulses from a pulse source determining the sweep recurrence frequency of the oscillator. It is preferred to use a high sweep recurrence frequency in the oscillator but where this is too high for utilisation in a radar of which the oscillator arrangement is to form part selected sweeps from the oscillator recurring at a lower frequency may be gated out for such utilisation—for example by means of a gate opened by pulses derived from a frequency divider fed with pulses from a pulse source which is also used to determine the sweep recurrence frequency of the oscillator.

Instead of gating the output of the phase detector, said output may be fed through low and high pass filters to remove higher beat frequencies and D.C. components and then fed to a detector the output of which is employed to effect frequency control of the swept oscillator.

Preferably output derived from the phase detector and employed to control the frequency of the oscillator is applied thereto through a filter including a coupling circuit providing a small control voltage component with a high cut off frequency and a much larger voltage which is effectively integrated.

Figures 2, 2A, 3:
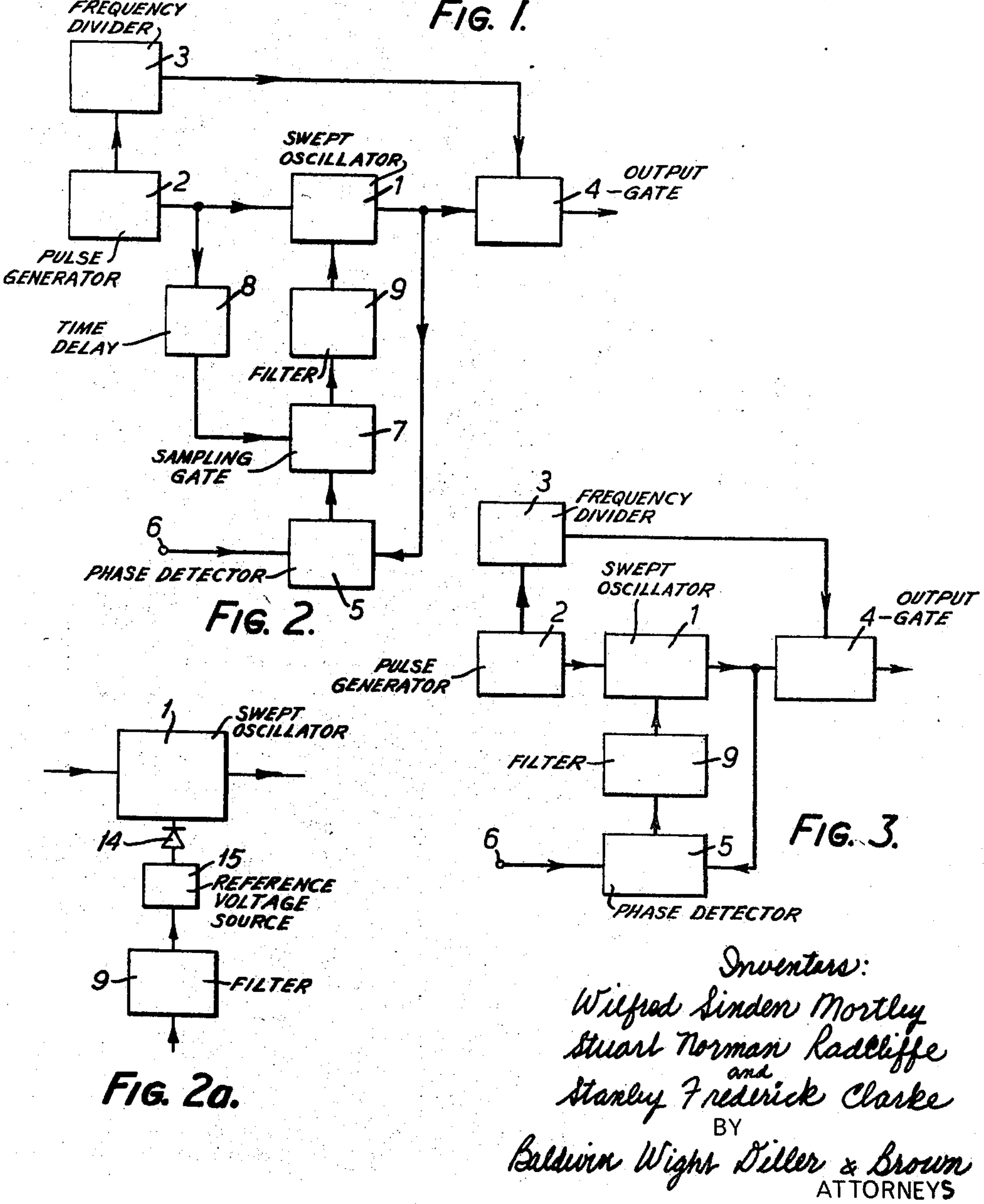
Figure 4:
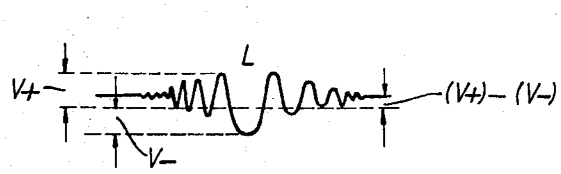
Figures 5, 6:
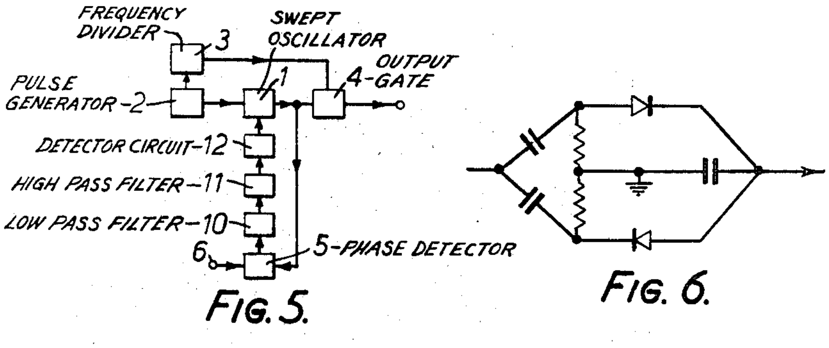
Figure 7:
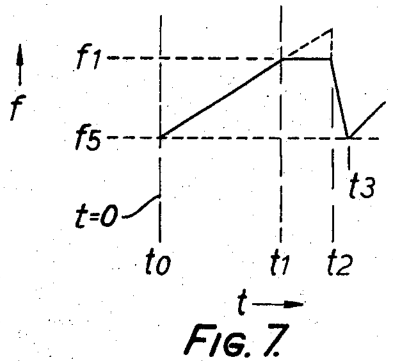
Figure 8:
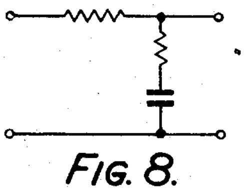

The invention is illustrated in and further explained in connection with the accompanying drawings in which FIGURES 1(*a*), (*b*) and (*c*), FIGURE 4 and FIGURE 7 are explanatory graphical figures; FIGURES 2, 3 and 5 are simplified block diagrams of embodiments of the invention; and FIGURES 6 and 8 are circuit diagrams of details.

If some of the output from a frequency swept oscillator is fed as one input to a phase detector the other input of which is a CW reference oscillation, the output therefrom, after filtering to remove the two input frequencies, will be the difference frequency which will fall towards zero as the oscillator frequency approaches the reference frequency and rise again after it has passed the reference frequency. The three diagrams (*a*), (*b*) and (*c*) of FIGURE 1 show three different phases at the instant of synchronism. All three show the same frequency and in all of them there is coherence with the reference oscillation. Between them the three diagrams show the range of phases (at synchronism) over which phase lock is held. FIGURES 1*a* and 1*c* show opposite extreme cases and FIGURE 1*b* shows a more central and therefore "safer"

setting. As will be seen there is the region where the two input frequencies to the detector are almost equal, a wide "loop" of phase reversal, the position and sign of the "loop" depending upon the relative phases at the point of coherence. In the absence of coherence between the two input frequencies the position of the "loop" will change from sweep to sweep but, if coherence is established, the position of the loop will be fixed. In extremes of phase it will be mostly positive or mostly negative as in (*a*) and (*c*) respectively of FIGURE 1.

In a preferred way of carrying out this invention the part of the detector output where the "loop" occurs is gated out to derive what may be termed a coherence error signal which is used in a servo feed-back circuit to maintain the oscillator phase substantially constant at this part of the sweep. A convenient way of doing this, without otherwise altering the sweep, is by applying the error signal fed back to control the oscillator frequency during the periods between sweeps. One way of doing this is to "catch" then end of the sweep by a diode 14 to which is applied a reference voltage from the reference voltage source 15 by which is varied by the output of the detector as shown in FIGURE 2*a*.

Obviously the servo control of the oscillator frequency will operate most rapidly and stably if the recurrence frequency of the sweep is high. However, in many radar systems, the recurrence frequency of the sweeps required by the radar is farily low. This difficulty may be overcome by using a high sweep recurrence frequency in the oscillator and providing a sampling output gate to take off, for normal use in the radar, only sweeps recurring at a relatively low frequency instead of all the sweeps. FIGURE 2 shows, in block diagram form, an embodiment in which this is done.

Referring to FIGURE 2, a swept oscillator 1 is swept in frequency over a desired band at a sweep recurrence frequency determined by a periodic pulse generator 2 of relatively high repetition frequency. Pulses from the generator 2 are also fed to a counter or other frequency divider 3 which produces pulses at a lower repetition frequency, as required by the radar of which the illustrated apparatus forms part. These pulses are applied to "open" an output gate 4 which passes the sweeps from the oscillator 1 to the part of the radar (not shown) which is to utilise them. In this way the sweep recurrence frequency in the output from gate 4 is made a desired fraction of that in the output from oscillator 1.

Output from the oscillator 1 is fed as one input to a phase detector 5 the other input to which is a CW reference oscillation applied at terminal 6 from a source not shown. The detected output from detector 5 illustrated in FIGURE 1, is fed to a sampling gate 7 which is opened, once per sweep of the oscillator 1, by pulses from the source 2 which are fed to said gate through a delay circuit or device 8 of pre-determined delay. When the gate 7 is open the desired part of the output from the detector 5 is gated out, i.e. passed, by the gate 7. The output of the gate 7, suitably filtered by a filter 9, is applied to control the frequency of the swept oscillator 1 outside a required sweep region to lock its phase to that of the reference source and thus obtain and maintain coherence with the reference oscillations.

If the sweep recurrence frequency of the oscillator 1 is made high enough—for example if the recurrence period is of the order of twice the duration of a sweep, the gate 7 (with its control circuit including delay circuit or device 8) may be dispensed with and the output of the detector 5 fed direct to the filter 9 as shown in FIGURE 3, because, with such a high sweep recurrence frequency, there will be sufficient phase dependent D.C. component at the output of the said detector for the control to operate.

If the number of cycles in each sweep of the oscillator is too large for reliable frequency control of the oscillator directly by the phase detector 5 (as shown in FIGURE 3), the use of the sampling gate 7 of FIGURE 2, with its control by the pulse source 2 via the delay cricuit or device 8, may be avoided by using a low pass filter to remove higher beat frequencies in the output from the phase detector, providing a high pass filter to remove D.C. components in said output and produced by asymmetry of diodes employed in the phase detector itself and then providing a detector adapted to detect the difference between positive and negative peak voltages. Such a difference will exist, in dependence upon phase, because the "loop" will demand that the base line be other than zero, except in the zero relative phase condition, in order to maintain zero average current. FIGURE 4 shows this graphically and conventionally and is drawn against time $t$. The loop occurring at zero relative phase of the inputs to the phase detector occurs at L. If V+ is the voltage at the first positive peak preceding the "loop" and V− is that at the bottom of the loop, the voltage, after the loop is passed will be asymptotic to $(V+)-(V-)$ as indicated. FIGURE 5 shows such an arrangement. Here 10 is the low pass filter, 11 the high pass filter and 12 the detector adapted to detect the difference between positive and negative peak voltages. Such a detector, suitable for use at 12 is shown in FIGURE 6 which is self-explanatory.

The sensitivity of phase to variation in the "catching frequency" of the oscillator will now be considered with reference to FIGURE 7 which shows graphically with frequency ($f$) against time ($t$) an oscillator sweep. The sweep starts at time $t=0$ at which the frequency is $f_S$. The frequency sweeps at a rate $df/dt=k$ until, at time $t_1$, a frequency $f_1$ is reached. The frequency is held until time $t_2$ whereupon it returns rapidly at time $t_3$ to the initial value $f_S$. The rate of return may not be constant but, for practical purposes, it may be assumed that a constant phase change occurs between $t_2$ and $t_3$. If this "flyback" period $t_3-t_2$ is much shorter than $t_1-t_0$—say a fifth or less— any "flyback" phase shift due to change of $f_S$ will be much smaller than that in the period $t_2-t_1$ and can be ignored in the present approximate considerations. Then the relations given in the following equations hold. In these equations phases and phase shifts are indicated by the letter $\phi$ supplemented by number corresponding to the times which apply. Thus $\phi_3$ is the phase at time $t_3$ and $\phi_{2-3}$ is the phase change between times $t_2$ and $t_3$.

$$f=f_s+kt_0^{t_1}$$

$$f=f_1=f_s+kt_1{}_{t_1}^{t_2}$$

$$\phi_{2-3}\doteq\text{const.}\ {}_{t_2}^{t_3}\ \text{(assumed constant henceforth)}$$

$$\phi_3=2\pi\int_0^{t_1}(f_s+kt)dt+2\pi\int_{t_1}^{t_2}(f_s+kt_1)dt+\phi_{2-3}$$

$$=2\pi f_s t_1+\frac{1}{2}kt_1^2+(f_s+kt_1)(t_2-t_1)+\phi_{2-3}$$

but from (2)

$$t_1=(f_1-f_S)k$$

$$\therefore \phi_3=2\pi\left[f_s(f_1-f_s)/k+\frac{1}{2}(f_1-f_s)^2/k+f_1\{t_2-f_1(-f_s)/k\}\right]+\phi_{2-3}$$

$$=2\pi\left[f_1t_2-\frac{1}{2}(f_1-f_s)^2k\right]+\phi_{2-3}$$

Hence $$d\phi_3/df_1=2\pi[t_2-(f_1-f_S)k]$$

For example, if $f_S=47$ mc./s., $f_1=73$ mc./s., $t_2=8$ $\mu$s. and $k=5$ mc./s./ then $d\phi_3$ $df_1=2\pi$ $(8-26/5)=17.6$ radians/mc./s.

Since control could not be exercised over more than $\pm\pi/2$ radians, $f_1$ would not need to be varied by more than 0.18 mc./s., which is only a small proportion of the total sweep (0.7%).

A better control action with more rapid locking and a wider locking range can be obtained by including in the filter 9 a coupling circuit providing a small control voltage component with a high cut-off frequency and a much large voltage component which is effectively integrated. FIGURE 8, which is self-explanatory, shows such a coupling circuit.

FIGURE 7 assumes that the oscillator frequency is swept upwards i.e. from a lower value to a higher one. Obviously the application of the invention is not limited to this case and can equally well be applied to a case in which the frequency is swept downwards, for either the upper or the lower frequency may be "caught" and used for control. It is also possible to introduce the required phase shift for maintenance of coherence—i.e. the temporary change of oscillator frequency—by means other than those described. Thus, for example, the output of the phase detector may be used to produce a pulse of modulating voltage either on a main modulating reactance in the oscillator circuit or on an independent reactance associated with the oscillator.

We claim:

1. A swept frequency oscillator arrangement comprising a swept frequency oscillator, a phase detector, means connecting said oscillator and detector for feeding oscillations from said oscillator to said phase detector, further means connected with said detector for feeding reference frequency oscillations to said detector, and means connected with said detector for utilizing the phase reversal occurring in the output from said detector when the swept oscillator frequency passes through the reference frequency for varying the frequency of the oscillator outside a required sweep region so as to lock its phase with that of the reference frequency.

2. An arrangement as claimed in claim 1 wherein in order to control the oscillator frequency during periods between sweeps there is employed a diode connected with said oscillator, reference voltage means connected with said diode for applying a reference voltage thereto to "catch" the end of the sweep, said output from said phase detector varying said reference voltage to effect the frequency variation of said oscillator.

3. An arrangement as claimed in claim 2 including gate means for gating the output of the phase detector, once per sweep of the oscillator, to separate that portion of said output during which the frequency of the oscillator approximates to the reference frequency, the separated portion of said output being employed to control the oscillator frequency.

4. An arrangement as claimed in claim 3 including a pulse source, said gate means being controlled by pulses from said pulse source, said pulse source being connected with said oscillator for determining the sweep recurrence frequency of the oscillator.

5. An arrangement as claimed in claim 4 including further gate means for gating out selected sweeps from the oscillator recurring at a lower frequency for use as the sweep recurrence frequency in the oscillator.

6. An arrangement as claimed in claim 5 including frequency divider means connected with said further gate means and said pulse source, the selected sweeps from the oscillator recurring at a lower frequency being gated out by means of a gate opened by pulses derived from said frequency divider means, said frequency divider means being fed with pulses from said pulse source.

7. An arrangement as claimed in claim 1 including low and high pass filters, and detector circuit means, the output of the phase detector being fed through said low and high pass filters to remove higher beat frequencies and D.C. components and being then fed to said detector circuit means, the output of which is connected with said swept oscillator to effect frequency control of the swept oscillator.

8. An arrangement as claimed in claim 7 wherein output derived from the phase detector and employed to control the frequency of the oscillator is applied thereto through a filter including coupling circuit means for providing a small control voltage component with a high cut off frequency and a much larger voltage which is effectively integrated.

9. A swept frequency oscillator arrangement comprising swept oscillator means for providing output sweeps of recurrently varying frequency, pulse generator means connected with said swept oscillator means for controlling the recurrence frequency of said sweeps, phase detector means, means for applying the output sweeps from said oscillator as a first input to said phase detector means, further means for applying a constant reference frequency as a second input to said phase detector means, said phase detector means combining the first and second inputs thereto to provide an output having a recurrent phase reversal corresponding to the combined inputs thereto where the frequency of said sweeps crosses the frequency of said constant reference frequency, and means interconnecting said swept oscillator means and said phase detector means for employing the output from said phase detector means only at and adjacent the points where said sweeps cross said reference frequency to vary the output frequency of said swept oscillator means to alter the phase thereof.

References Cited

UNITED STATES PATENTS

| | | | |
|---|---|---|---|
| 2,968,769 | 1/1961 | Johnson et al. | 331—14 |
| 3,195,069 | 7/1965 | Adams et al. | 331—14 |
| 3,231,820 | 1/1966 | Cayzac | 331—14 |

JOHN KOMINSKI, *Primary Examiner.*

U.S. Cl. X.R.

331—4, 14, 17; 325—332, 335; 343—17.2